United States Patent
Kwon et al.

(10) Patent No.: US 9,964,588 B2
(45) Date of Patent: May 8, 2018

(54) HANDLER FOR TESTING SEMICONDUCTOR DEVICE AND METHOD FOR CHECKING WHETHER SEMICONDUCTOR DEVICE REMAINS USING THE SAME

(71) Applicant: TECHWING CO., LTD., Hwaseong-si, Gyeonggi-do (KR)

(72) Inventors: Sung Il Kwon, Hwaseong-si (KR); Jae Hun Jeong, Osan-si (KR)

(73) Assignee: TECHWING CO., LTD., Hwaseong-si, Gyeonggi-Do (KR)

( * ) Notice: Subject to any disclaimer, the term of this patent is extended or adjusted under 35 U.S.C. 154(b) by 165 days.

(21) Appl. No.: 14/250,006

(22) Filed: Apr. 10, 2014

(65) Prior Publication Data

US 2014/0313317 A1    Oct. 23, 2014

(30) Foreign Application Priority Data

Apr. 17, 2013  (KR) .......................... 10-2013-0042273

(51) Int. Cl.
*H04N 9/47*    (2006.01)
*H04N 7/18*    (2006.01)
*G01R 31/28*  (2006.01)

(52) U.S. Cl.
CPC ................ *G01R 31/2893* (2013.01)

(58) Field of Classification Search
CPC ....................................................... G06T 7/00
USPC ........................................................... 348/87
See application file for complete search history.

(56) References Cited

U.S. PATENT DOCUMENTS 6,024,526 A  *  2/2000  Slocum ................. B25J 17/0216
                                                                414/226.01
6,111,246 A  *  8/2000  Watanabe ............ G01R 31/2834
                                                                209/573
6,184,675 B1 *  2/2001  Bannai .................... G01R 31/01
                                                                324/750.03

(Continued)

FOREIGN PATENT DOCUMENTS

JP    2011-242149 A    12/2011
TW    201144837           12/2011
WO    WO 2013023130 A1 *  2/2013 ............ B25J 9/1962

OTHER PUBLICATIONS

Taiwanese Office Action dated May 26, 2015 issued in corresponding Taiwanese Patent Application No. 103113657, 8 Pages. With concise explanation of relevance.

*Primary Examiner* — Mohammed Rahaman
*Assistant Examiner* — Richard A Hansell, Jr.
(74) *Attorney, Agent, or Firm* — Fenwick & West LLP

(57) ABSTRACT

A handler for testing semiconductor device is disclosed. The handler for testing semiconductor device includes a socket plate having a test socket to be electrically connected to a tester, a device feeder configured to feed a semiconductor device to the test socket or recover the semiconductor device from the test socket, a camera obtaining an image of the test socket, a sensor sensing an exposing moment that at least one photographing area among photographing areas on the test socket is exposed to the camera, while the device feeder moves, and a controller configured to operate the camera to take a photograph at the exposing moment and to determine whether a semiconductor device remains in the test socket, using the image obtained by the camera.

15 Claims, 14 Drawing Sheets

(56) References Cited

U.S. PATENT DOCUMENTS

| | | | | |
|---|---|---|---|---|
| 2003/0113010 A1* | 6/2003 | Hwang | ............ | G01R 31/01 |
| | | | | 382/151 |
| 2008/0317575 A1* | 12/2008 | Yamazaki | ......... | G01R 31/2893 |
| | | | | 414/754 |
| 2009/0098667 A1* | 4/2009 | Behler | ............ | G05B 19/4015 |
| | | | | 438/15 |
| 2009/0148257 A1* | 6/2009 | Shim | ............ | G01R 31/2893 |
| | | | | 414/222.02 |
| 2009/0268021 A1* | 10/2009 | Kawaragi | ......... | G01B 11/002 |
| | | | | 348/87 |
| 2011/0254945 A1* | 10/2011 | Kikuchi | ............ | G01R 31/2893 |
| | | | | 348/126 |
| 2011/0279136 A1* | 11/2011 | Shiozawa | ......... | G01R 31/2891 |
| | | | | 324/750.23 |
| 2012/0034052 A1* | 2/2012 | Yamazaki | ......... | G01R 31/2893 |
| | | | | 414/222.02 |
| 2013/0223475 A1* | 8/2013 | Yoon | ............ | G01R 31/2642 |
| | | | | 374/57 |

\* cited by examiner

HANDLER FOR TESTING SEMICONDUCTOR DEVICE AND METHOD FOR CHECKING WHETHER SEMICONDUCTOR DEVICE REMAINS USING THE SAME

CROSS-REFERENCE TO RELATED APPLICATIONS

The present application claims benefit of priority to Korean Patent Application No. 10-2013-0042273 filed on Apr. 17, 2013, which is incorporated by reference herein in its entirety.

FIELD OF THE INVENTION

The present invention relates to a handler for testing semiconductor devices and a method for checking whether a semiconductor device remains in a test socket, using the same.

BACKGROUND OF THE INVENTION

A handler for testing semiconductor devices (hereinafter, "handler") is an equipment configured to electrically connect semiconductor devices fabricated with the scheduled manufacturing process to a tester and to classify the semiconductor devices according to the result of test.

A handler used for testing semiconductor devices is disclosed in various patent documents, such as Japanese Patent Laid-open Publication No. 2011-242149 (hereinafter, "the related art").

In the proposed related art technology, the semiconductor devices are fed or recovered to and from the test sockets (in the related art, named by "sockets for inspection"), using the device feeders (in the related art, named by "heads for inspection").

The test may be carried out in a way of electrically connecting the semiconductor devices fed into the test sockets by the device feeders to the tester. The semiconductor devices finished in testing may be recovered from the test sockets by the device feeders. At this moment, it may occur that a semiconductor device finished in testing may not be recovered from the test socket due to malfunction of the related components and may remain in the test socket. In this case, when a new semiconductor device is fed into the test socket by the device feeder, the remaining semiconductor device, the new semiconductor device or the test socket may be damaged.

To prevent such a case, the related art uses a method for determining whether a semiconductor device finished in testing remains in a way of taking a photograph of the test socket using a fourth photographing apparatus and analyzing data of the photograph.

Meanwhile, a handler in these days includes a pair of device feeders which feeds and recovers the semiconductor devices to and from the test sockets alternately, thereby achieving higher rate of processing. Hereinafter, such a method for feeding and recovering the semiconductor devices will be described in detail with reference to FIG. 1 and FIGS. 2A and 2B.

A pair of device feeders 141, 142 while reciprocating in the forward and backward direction (see arrow) feeds the semiconductor devices (D) to the test sockets 171 or recovers the semiconductor devices from the test sockets 171. For example, in case where eight test sockets 171 are arranged with a 4×2 matrix form in the socket plate 170, each of the pair of device feeders 141, 142 has eight pickers (P) with a 4×2 matrix form in order to grip or release gripping eight semiconductor devices.

In the handler having the above configuration, for example, in case where as remarked by (W), the first device feeder 141 positioned in the upper portion of the socket plate 170 recovers the semiconductor devices (D) from the test sockets 171, in the state shown in FIG. 2A, the second device feeder 142 may be positioned in the upper portion of the socket plate 170 as the pair of device feeders 141, 142 continues to move forward together, as the state shown in FIG. 2B.

In the state shown in FIG. 2B, the semiconductor devices (D) are fed to the test sockets 171 by the second device feeder 142, as remarked by (S), and then test thereof is initiated. At this moment, the first device feeder 141 puts down the semiconductor devices (D) finished in testing on one side of the first pocket table 111a and then grips the semiconductor devices (D) to be tested from the other side of the first pocket table 111a.

For such an operation, the first pocket table 111a is configured to move in the left and right directions. When the semiconductor devices (D) fed into the test sockets 171 by the second device feeder 142 are finished in testing, the second device feeder 142 recovers the semiconductor devices (D) finished in testing from the test sockets 171. At this moment, the second device feeder 142 moves backward together with the pair of device feeders 141, 142, and thereby the first device feeder 141 becomes to be positioned in the upper portion of the socket plate 170, as the state shown in FIG. 2A. Likewise, in the state shown in FIG. 2A, the first device feeder 141 feeds the semiconductor devices (D) to the test sockets 171. Next, the second device feeder 142 puts down the semiconductor devices (D) finished in testing on the second pocket table 112a, and grips new semiconductor devices (D) to be tested.

As described above, the semiconductor devices (D) are fed or recovered alternatively using the pair of device feeders 141, 142, thereby improving a processing efficiency.

However, it is difficult for a camera to take a photograph of the plane of the test socket 171 because the pair of device feeders 141, 142 is positioned in the upper portion of the test socket 171 alternatively and also moves on the test socket 171.

The camera may be configured to take a photograph of the test sockets 171 under the stationary state after the pair of device feeders 141, 142 is deviated from the upper portion of the socket plate 170 in order to solve such a difficulty, which however results in lower processing efficiency.

SUMMARY OF THE INVENTION

In view of the above, the present invention provides a technique that is capable to check whether a semiconductor device remains in the test socket, while a device feeder is free to move along the work path.

In accordance with one aspect of one or more embodiments of the present invention, there is provided a handler for testing semiconductor devices, which includes: a socket plate having a test socket to be electrically connected to a tester; a device feeder configured to feed a semiconductor device to the test socket or recover the semiconductor device from the test socket; a camera obtaining an image of the test socket; a sensor sensing an exposing moment that at least one photographing area among photographing areas on the test socket is exposed to the camera, while the device feeder moves; and a controller configured to operate the camera to take a photograph at the exposing moment and to determine whether a semiconductor device remains in the test socket, using the image obtained by the camera.

In the embodiments, the device feeder may be one of at least one pair of device feeders. The at least one pair of device feeders may feed the semiconductor devices to the test sockets alternatively or recover the semiconductor devices from the test sockets alternatively. The at least one pair of device feeders may move together and be spaced apart from each other by a predetermined interval.

In the embodiments, the sensor may sense the exposing moment that the at least one photographing area is exposed to the camera through the predetermined interval.

In the embodiments, the test socket may be one of a plurality of test sockets and arranged in the socket plate with an M×N (where M≥1 and N≥2) matrix form.

In the embodiments, the sensor may sense a first exposing moment that one photographing area among the photographing areas is exposed to the camera through the predetermined interval, while the at least one pair of device feeders moves, and a second exposing moment that the other photographing area among the photographing areas is exposed to the camera through the predetermined interval, while the at least one pair of device feeders continues to move.

In the embodiments, the controller may operate the camera to take a photograph at the first exposing moment and the second exposing moment respectively, and using a plurality of images obtained by the camera, determine whether a semiconductor device remains in the test socket.

In the embodiments, the sensor may be one of at least two sensors, and one of the at least two sensors may sense the first exposing moment, and the other sensor of the at least two sensors may sense the second exposing moment.

In the embodiments, the camera may be one of a plurality of cameras, and the plurality of cameras may be positioned on the left and on the right based on the gripping position where the device feeder grips the semiconductor devices.

In the embodiments, the test socket may be one of a plurality of test sockets so as to be arranged with a matrix form in more than two rows. The device feeder may be one of at least one pair of device feeders that moves together and are spaced apart from each other by a predetermined interval. A portion of cameras of the plurality of cameras may take images of the test sockets corresponding to a portion of row in the plurality of test sockets, and the other portion of cameras of the plurality of cameras may take images of the test sockets corresponding to the other portion of row in the plurality of test sockets.

In accordance with another aspect of one or more embodiments of the present invention, there is provided a method for checking whether a semiconductor device finished in testing remains without being recovered when testing the semiconductor device using a handler for testing semiconductor devices, which includes gripping the semiconductor device finished in testing from a test socket using a first device feeder in order to recover the semiconductor device finished in testing and gripping the semiconductor device to be tested using a second device feeder moving together with the first device feeder and spaced apart from each other by a predetermined interval in order to feed the semiconductor device to be tested to the test socket; moving the first device feeder and the second device feeder; sensing an exposing moment of the test socket to be exposed through the predetermined interval, while the first device feeder and the second device feeder move; obtaining an image of the test socket by taking a photograph of the test socket at an exposing moment of the test socket through the predetermined interval; and determining whether the semiconductor device finished in testing remains in the test socket using the image.

In the embodiments, the sensing the exposing moment of the test socket to be exposed through the predetermined interval and the obtaining the image of the test socket may be executed repeatedly when the first device feeder and the second device feeder move in one direction and also, when the first device feeder and the second device feeder move in an opposite direction of the one direction.

In the embodiments, the sensing the exposing moment of the test socket to be exposed through the predetermined interval may include sensing an exposing moment of a portion of the test socket to be exposed through the predetermined interval and sensing an exposing moment of the other portion of the test socket to be exposed through the predetermined interval.

In the embodiments, the obtaining the image of the test socket may include obtaining an image of a portion of the test socket at the moment when the portion of the test socket is exposed and obtaining an image of the other portion of the test socket at the moment when the other portion of the test socket is exposed.

In the embodiments, the determining whether a semiconductor device finished in testing remains in the test socket may include combining the image of the portion of test socket with the image of the other portion of test socket.

According to the embodiments described above, it is capable to check whether a semiconductor device remains in the test socket, while a device feeder is free to move along the work path, thereby improving a processing efficiency.

Especially, in case where a plurality of device feeders feeds the semiconductor devices to the test sockets alternatively, or recovers the semiconductor devices from the test sockets alternately, a processing efficiency can be remarkably improved.

BRIEF DESCRIPTION OF THE DRAWINGS

The above and other objects and features of the present invention will become apparent from the following description of the embodiments given in conjunction with the accompanying drawings, in which.

DETAILED DESCRIPTION OF THE EMBODIMENTS

Hereinafter, particular embodiments for implementing the idea of the present invention will be described in detail with reference to the accompanying drawings.

In addition, in describing the present invention, in case particular descriptions of the present invention for the related well-known configurations or functions are considered to obscure the gist of the present invention, detailed descriptions thereof may be omitted.

Figure 1:
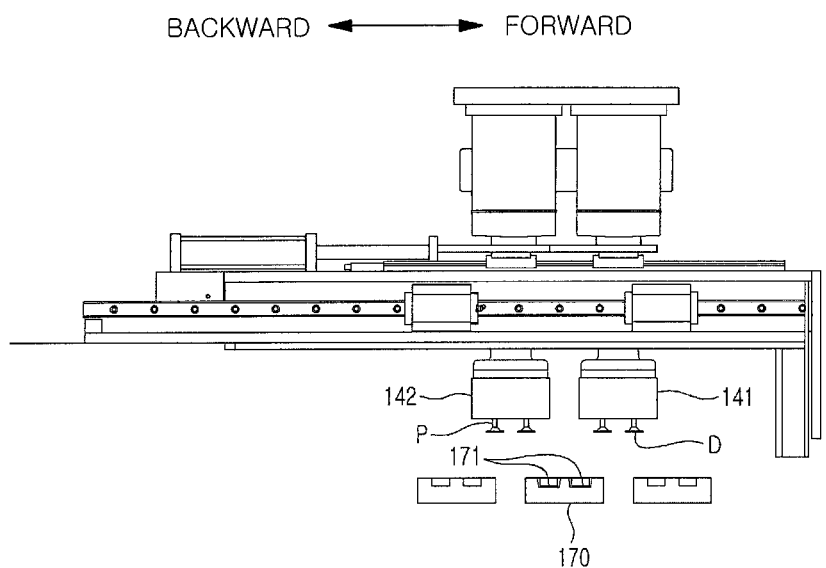
FIG. 1 and FIGS. 2A and 2B are views illustrating scheme of feeding and recovering semiconductor devices in accordance with a related art.
Figure 2A:
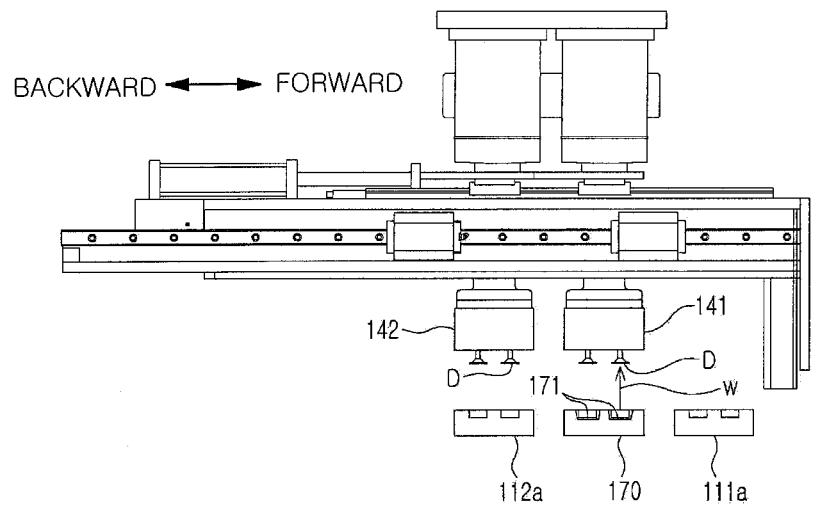
Figure 2B:
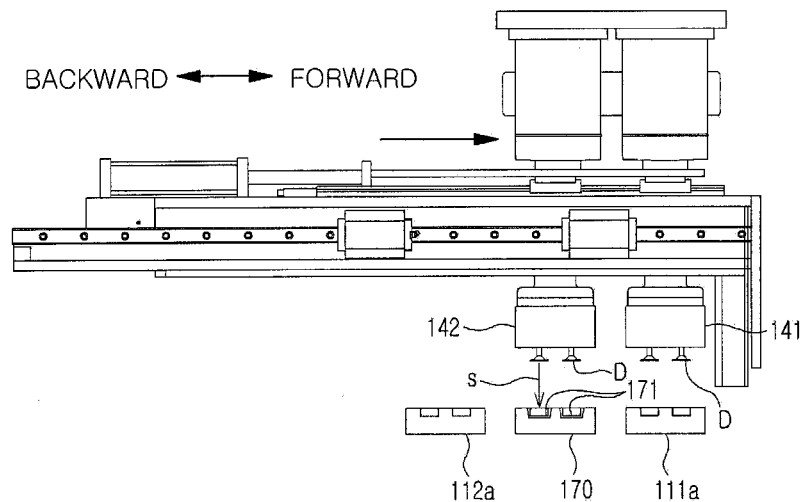
Figure 3:
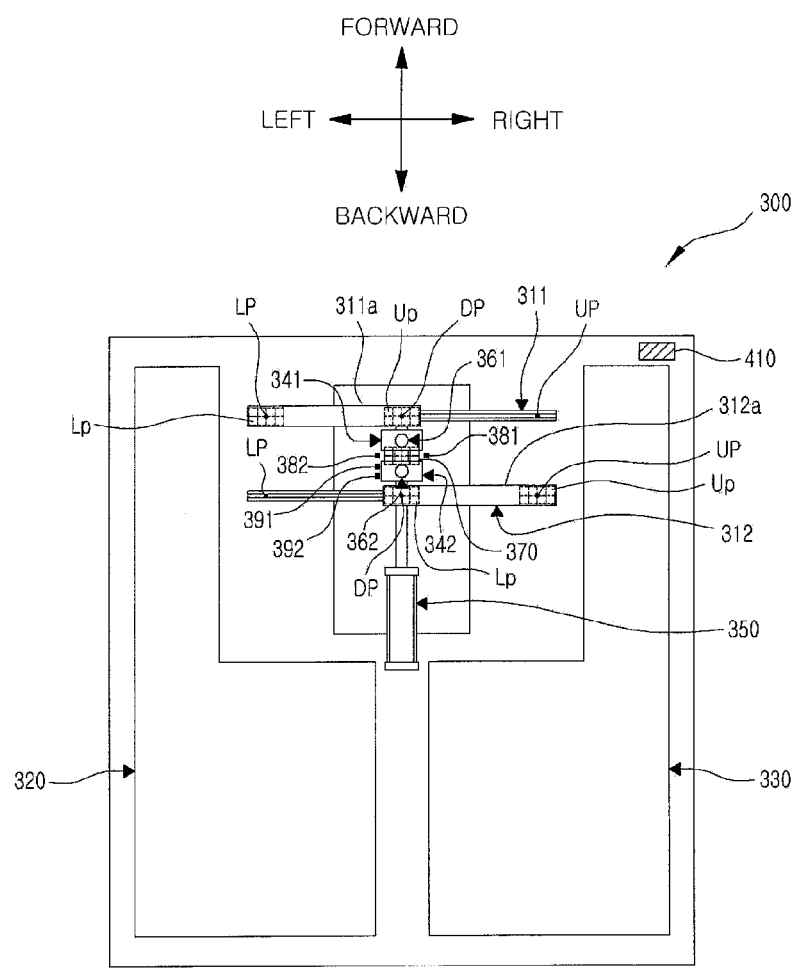
FIG. 3 is a schematic plan view of a handler in accordance with an embodiment.
Figure 4:
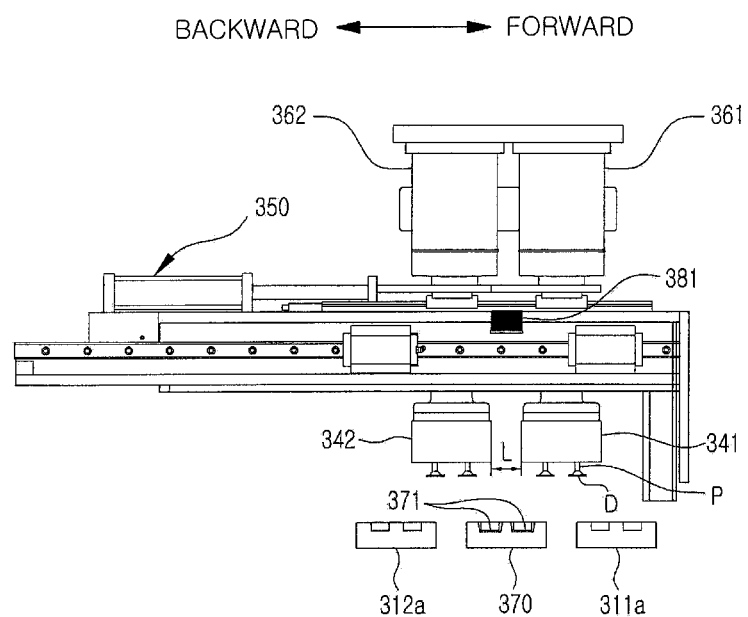
FIG. 4 is a schematic side view of the handler depicted in FIG. 3.

FIG. 3 is a conceptual plan view of a handler 300 for testing semiconductor devices (hereinafter, "handler") in accordance with an embodiment, and FIG. 4 is a schematic side view of the handler 300.

Referring to FIG. 3 and FIG. 4, the handler 300 in accordance with the present embodiment includes a pair of shuttles 311, 312, a loading portion 320 and an unloading portion 330, a pair of device feeders 341, 342 and a horizontal mover 350, a first vertical mover 361, a second vertical mover 362, a socket plate 370 (referring to FIG. 3), a pair of cameras 381, 382, a pair the sensors 391, 392, a controller 410, and the like.

The pair of shuttles 311, 312 has pocket tables 311a, 311b reciprocating on a straight line on which a loading position (LP), a gripping position (DP) and an unloading position (UP) are connected each other in the right and left directions. The pocket tables 311a, 311b have eight loading pockets (Lp) and eight unloading pockets (Up) on which semiconductor devices can be loaded. Here, the loading pocket (Lp) reciprocates between the loading position (LP) and the gripping position (DP) by reciprocating of the pocket tables 311a, 311b, and the unloading pocket (Up) reciprocates between the loading position (LP) and the gripping position (DP) by reciprocating of the pocket tables 311a, 311b. And, the loading pockets (Lp) and the unloading pockets (Up) are arranged in a 4×2 matrix form.

In the loading portion 320, semiconductor devices to be tested are loaded on the loading pockets (Lp) of the shuttles 311, 312.

In the unloading portion 330, semiconductor devices finished in testing are unloaded from the unloading pockets (Up) of the shuttles 311, 312.

For reference, the loading portion 320 and the unloading portion 330 may be provided separately each other, or may be provided integrally for common use of loading and unloading.

Loading and unloading techniques of semiconductor devices are already well-known in various applications, and thus detailed description thereof is omitted.

The pair of device feeders 341, 342 feeds eight semiconductor devices into eight test sockets arranged in the socket plate 370. For this purpose, each of the pair of device feeders 341, 342 has eight pickers (P) with a 4×2 matrix form respectively which enables semiconductor devices to be gripped or released from gripping. The pair of device feeders 341, 342 is spaced apart from each other at a predetermined interval (L).

The horizontal mover 350 moves the pair of device feeders 341, 342 forward and backward in a horizontal direction.

The first vertical mover 361 moves the first device feeder 341 to an up and down directions, and the second vertical mover 362 moves the second device feeder 342 to an up and down direction. When the device feeders 341, 342 grip the semiconductor devices (D) on the pocket tables 311a, 312a, or put down the semiconductor devices (D) on the pocket tables 311a, 312a, and when the device feeders 341, 342 feed the semiconductor devices (D) to the socket plate 370, or recover the semiconductor devices (D) from the socket plate 370, such the first vertical mover 361 and the second vertical mover 362 become to operate.

Figure 5:
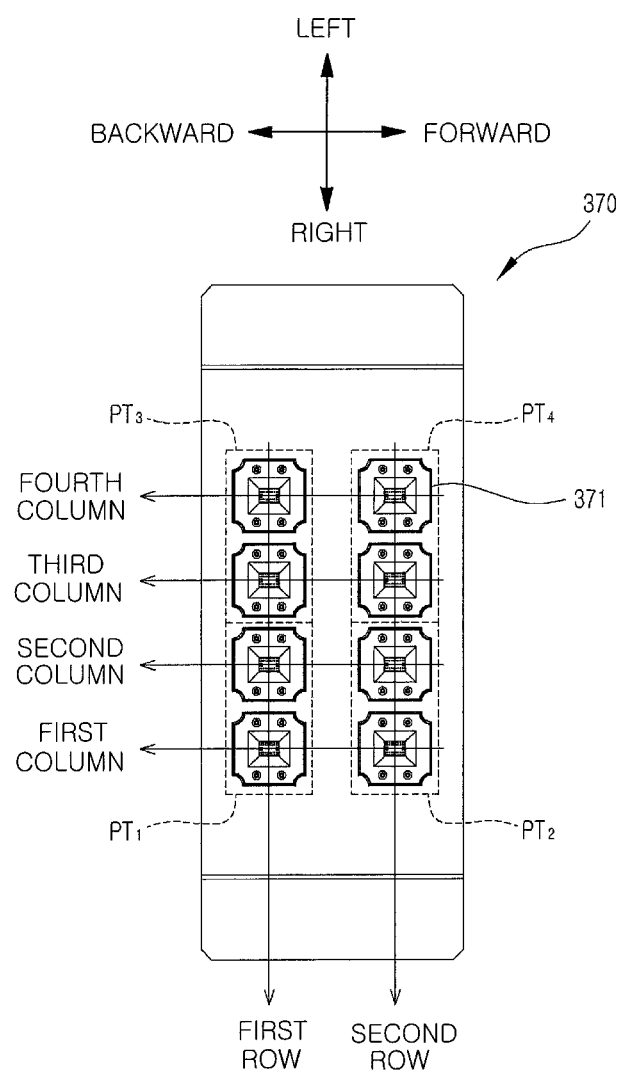
FIG. 5 is a schematic plan view of a socket plate mounted to the handler depicted in FIG. 3.

As shown in FIG. 5, eight test sockets 371 are installed with a 4×2 matrix form in the socket plate 370, and each of test sockets 371 is electrically connected to a tester (not shown, from the configuration point of view, it may be separated as a main body of tester). Eight semiconductor devices (D) are fed to eight test sockets 371 respectively by the device feeders 341, 342.

In the present embodiment, under the state that the semiconductor devices (D) are fed to the test sockets 371 of the socket plate 370 by the device feeders 341, 342, the semiconductor devices (D) will be electrically connected to the tester. Therefore, a feed point where the semiconductor devices (D) are fed by the device feeders 341, 342 becomes the point where the test pocket 371 is positioned on the socket plate 370. According to a Korean Patent Application No. 2013-0036093 (entitled "HANDLER FOR TESTING FOR SEMICONDUCTOR DEVICES) previously filed by and assigned to the same assignee as this present applicant, however, under the state that the semiconductor devices are fed to the pocket plate, the semiconductor devices will be electrically connected to the test socket. According to this example, a feed point where the semiconductor devices are fed by the device feeders is the point where the device pockets are positioned on the pocket plate. Of course, regardless of confirming the present embodiment or confirming the above Korean Patent Application No. 2013-0036093, the feed point will be corresponded to the test socket one to one.

The pair of cameras 381, 382 is provided to the upper portions of both ends of the socket plate 370. Such the pair of cameras 381, 382 take photographs of a first photographing area (PT1) to a fourth photographing area (PT4) of the socket plate 370 in order to take photographs of the feed points (test sockets in the present embodiment) arranged with a 4×2 matrix form. At this moment, the first camera 381 takes photographs of the plane of feed points of two columns (first column and second column in FIG. 5) in the right corresponded to the first photographing area (PT1) and the second photographing area (PT2), and the second camera takes photographs of the plane of feed points of two columns (third column and fourth column in FIG. 5) in the left corresponded to the third photographing area (PT3) and the fourth photographing area (PT4).

The pair of sensors 391, 392 senses exposing moments that the photographing areas (PT1 to PT4) are exposed through the predetermined interval (L) between the pair of device feeders 341, 342 while moving.

Figure 6:
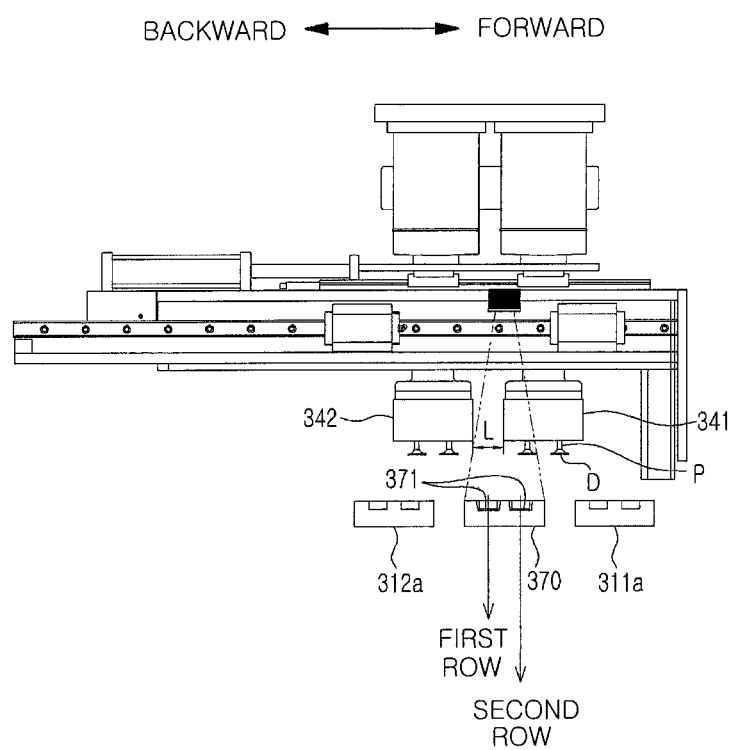
FIG. 6 and FIG. 7 are views illustrating exposing states of a test socket to a camera respectively.
Figure 7:
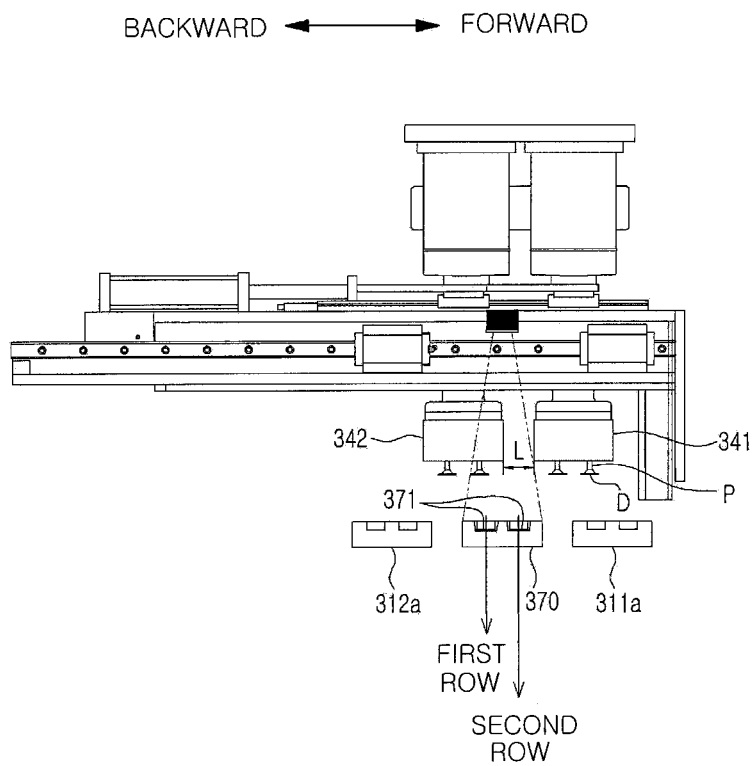

For example, as shown in FIG. 6, the first exposing moment when four test sockets 371 positioned in the first row within the first photographing area (PT1) and the third photographing area (PT3) are exposed through the predetermined interval (L) between the pair of device feeders 341, 342 by the first camera 381 and the second camera 382 is sensed by the first sensor 391. Next, as shown in FIG. 7, the second exposing moment when four test sockets 371 positioned in the second row within the second photographing area (PT2) and the fourth photographing area (PT4) are exposed through the predetermined interval (L) between the pair of device feeders 341, 342 by the first camera 381 and the second camera 382 is sensed by the second sensor 392.

In the present embodiment, two sensors 391, 392 are provided in order to sense the first exposing moment and the second exposing moment. In some cases, however, two identifiers spaced apart at a predetermined interval on a moving path of a pair of device feeders may be provided, and one of two sensors may be configured to sense the two identifiers one by one sequentially, thereby sensing the first exposing moment and the second exposing moment.

The controller 410 is configured to operate the first camera 381 and the second camera 382 to take photographs at the first exposing moment and the second exposing moment respectively. Further, the controller 410 determines whether the semiconductor devices are positioned in the feed points using images photographed by the first camera 381 and the second camera 382.

Next, the operation method of the handler 300 having the above mentioned configuration will be described.

The techniques that the semiconductor devices (D) are fed into the sockets 371 and recovered from the sockets 371 by two device feeders 341, 342 was previously described, and thus, hereinafter, detailed description thereof will be omitted.

Figure 8:
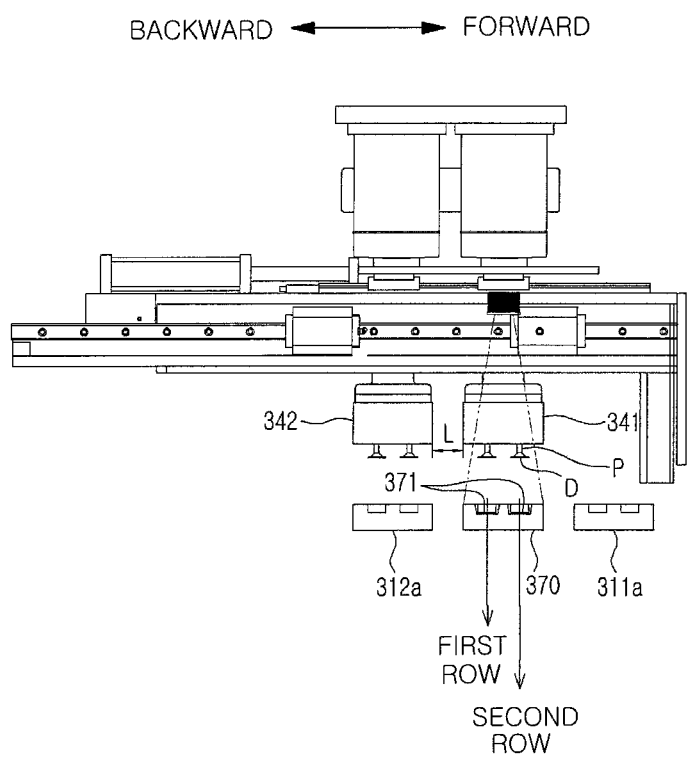
FIG. 8 to FIG. 14 are views illustrating operation methods of the handler depicted in FIG. 3.

FIG. 8 is a drawing illustrating the state that the first device feeder 341 grips the semiconductor devices (D) recovered from the feed point (test socket) after testing, and the second device feeder 342 grips the semiconductor devices (D) to be tested.

Figure 9:
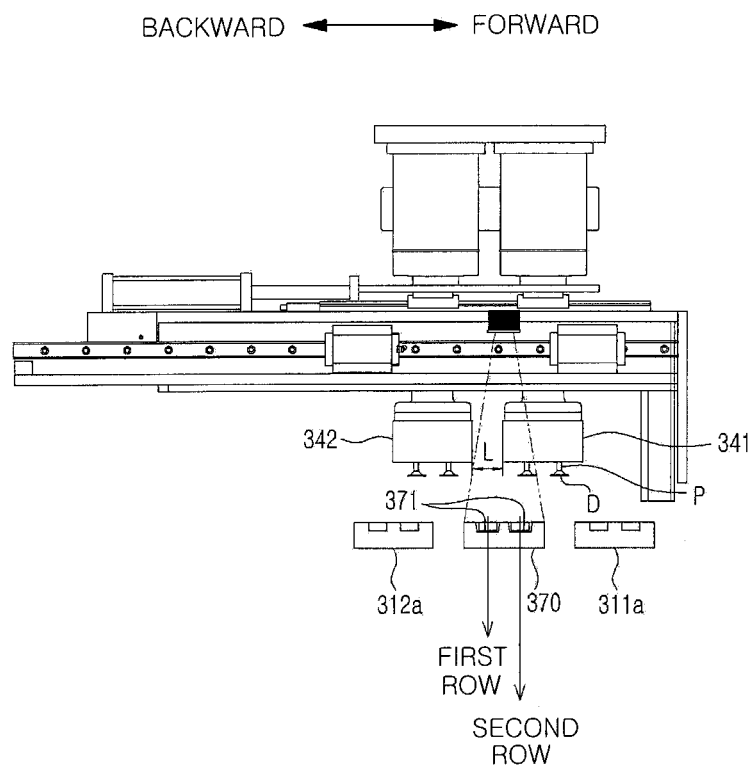
Figure 10:
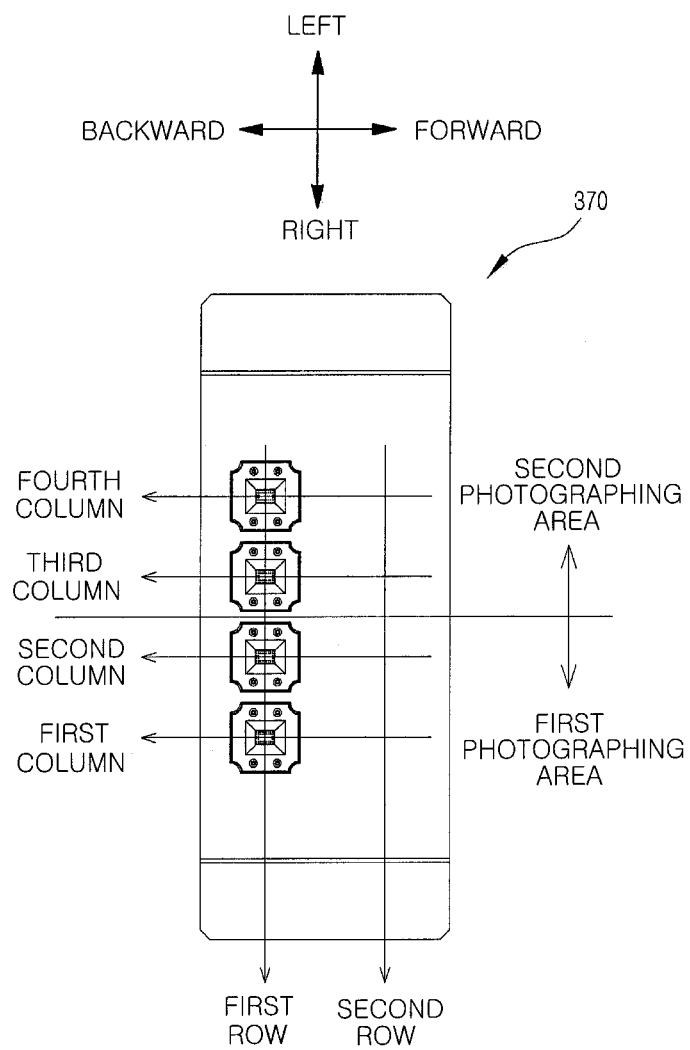

In the state as depicted in FIG. 8, the pair of device feeders 341, 342 moves forward, and accordingly, as depicted in FIG. 9, the test sockets 371 in the first row become to be exposed through the predetermined interval (L) between the device feeders 341, 342 by the pair of cameras 381, 382. When the first sensor 391 senses such the first exposing moment, the controller 410 makes the first camera 381 and the second camera 382 to acquire images as shown in FIG. 10.

Here, because the test sockets 371 in the first column and the second column among the test sockets 371 in the first row are belonged to the first photographing area (PT1), such the test sockets 371 in the first column and the second column are taken photographs by the first camera 381, and because the test sockets 371 in the third column and the fourth column are belonged to the third photographing area (PT3), such the test sockets 371 in the third column and the fourth column are taken photographs by the second camera 382. In this case, the test sockets 371 in the second row are covered with the first device feeder 341, thereby preventing from being taken photographs.

Figure 11:
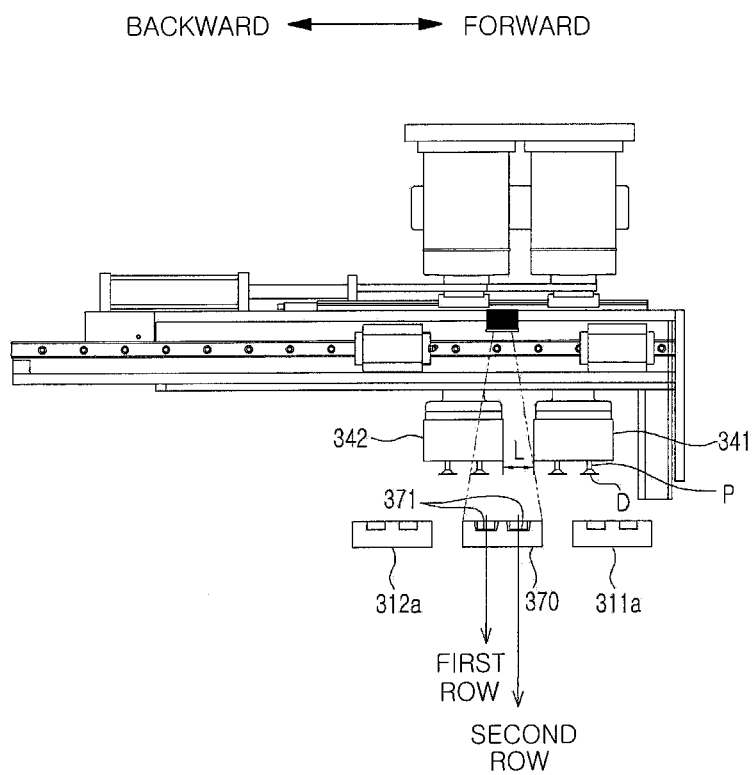
Figure 12:
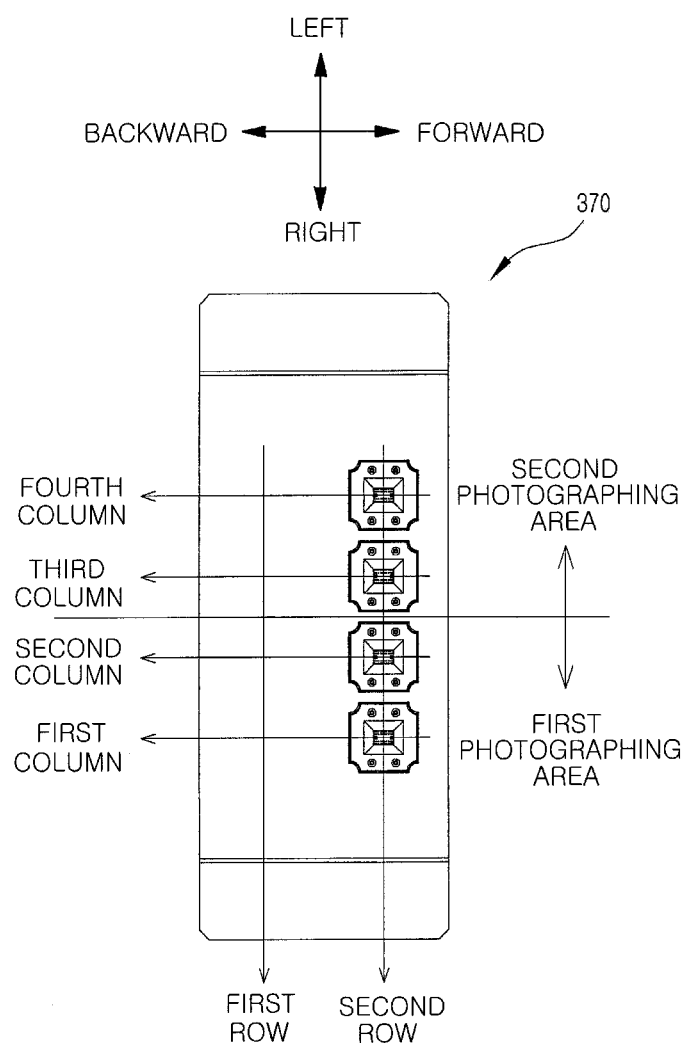

Further, in the state as depicted in FIG. 9, the pair of device feeders 341, 342 continues to move forward, and accordingly, as shown in FIG. 11, the test sockets 371 in the second row are exposed through the predetermined interval (L) between the device feeders 341, 342 by the pair of cameras 381, 382. When the second sensor 392 senses such the second exposing moment, the controller 410 operates the pair of cameras 381, 382 to take photographs of the second photographing area (PT2) and the fourth photographing area (PT3), thereby taking images of the test sockets 371 as shown in FIG. 12

Figure 13:
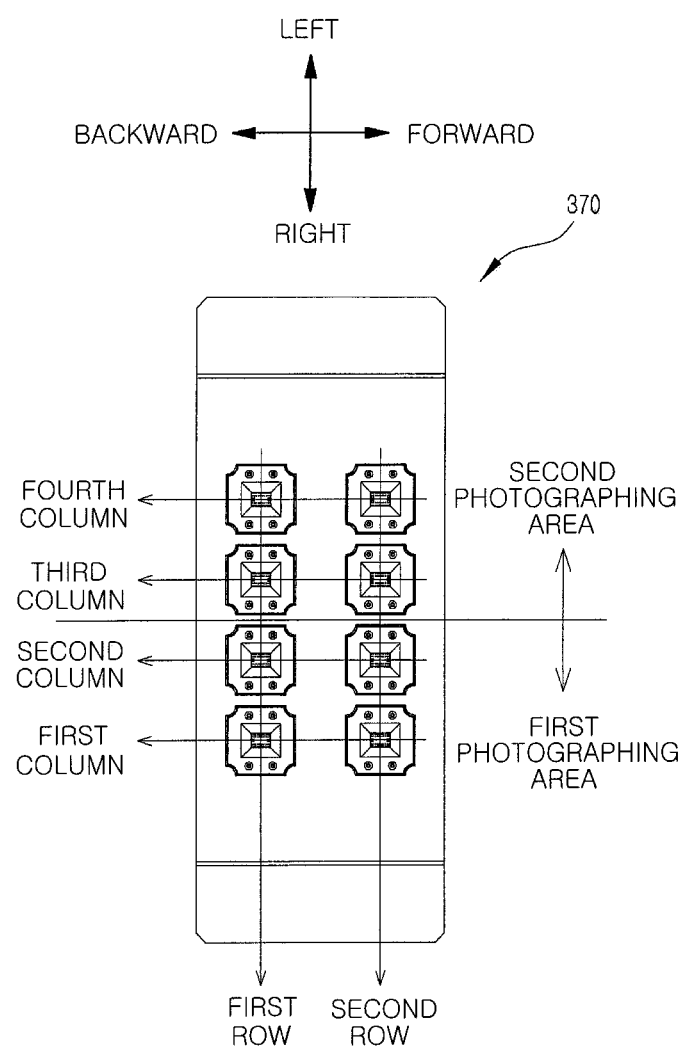

When all of plane images of the test sockets 371 with a 4×2 matrix form has been obtained by two times of photographing, as shown in FIG. 13, the controller 410 combines images photographed by the pair of cameras 381, 382 and determines whether a semiconductor device (D) remains at the feed points. Of course, whether a semiconductor device (D) remains may be determined by taking a photograph each, not by combining the images.

Figure 14:
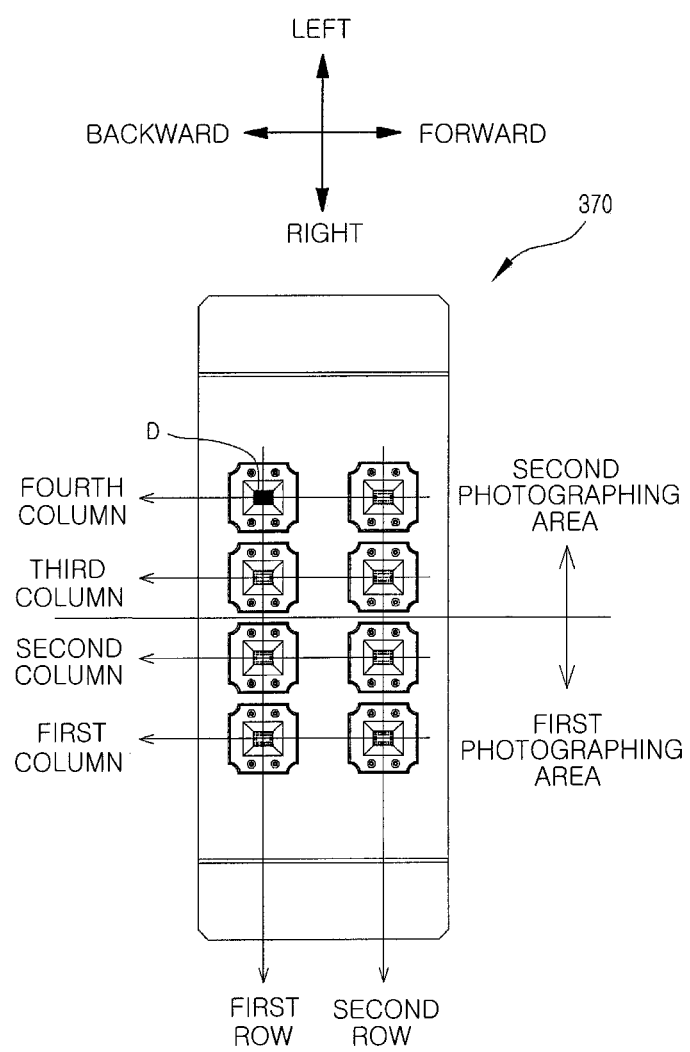

In case where no semiconductor device (D) remains, as shown in FIG. 13, the handler 300 continues to operate, but in case where any of the semiconductor devices (D) remains, as shown in FIG. 14, jam occurs.

In case where no semiconductor device (D) remains, when the pair of device feeders 341, 342 continues to move forward in the state as depicted in FIG. 11, and thus the second device feeder 342 arrives at the upper portion of the socket plate 370, the second device feeder 342 feeds the semiconductor devices (D) to the feed points, and the first device feeder 341 puts down the semiconductor devices (D) finished in testing on the first pocket table 311a and then grips new semiconductor devices to be tested.

Such an operation method may be applied as it is, even when the pair of device feeders 341, 342 moves backward in the reverse direction. Of course, in case where the pair of device feeders 342, 342 moves backward in the reverse direction, the test sockets 371 in the second row may be photographed first, and the test sockets 371 in the first row may be photographed later. In other words, each time when the pair of device feeder 341, 342 moves forward or backward, two times of photographs are taken each.

Meanwhile, as shown in FIG. 9 or FIG. 11, the predetermined interval (L) between the device feeders 341, 342 may be an extent of interval for the test sockets 371 in the first row to be exposed to the cameras 381, 382. Accordingly, the handler 300 can be reduced in a whole size, and also easier designing and manufacturing thereof are possible. However, the predetermined interval (L) is not limited thereto, and may be an extent of interval that the test sockets 371 in one row can be photographed dividedly, as long as photographing speed of the cameras 381, 382 as well as processing speed of images is allowed. In other words, the above predetermined interval (L) may be an extent of interval that all the test sockets 371 in one row are not exposed to the cameras 381, 382. In this case, the images photographed dividedly in one row may be combined by the controller 410 later. In case where photographing speed of the cameras 381, 382 and processing speed of images are not sufficient, or in case where it is possible to determine clearly remaining or not of a semiconductor device (D) even by photographing non-continuously the test sockets 371 in one row through a predetermined interval, the test sockets 371 in one row may be photographed non-continuously through the predetermined interval.

In the embodiment described in the above, it is assumed that eight semiconductor devices are tested together with a 4×2 matrix form, however, the technical idea of the present embodiment may be applied to the case where more matrix forms, i.e., eight or more semiconductor devices are tested together. Further, the technical idea of the present embodiment may be applied to the cases where one or more semiconductor devices are tested, where the semiconductor devices in a plurality of columns and in one row are tested, and where the semiconductor devices in one column and in a plurality of rows are tested, or the like. In addition, for such various cases, only one camera may be provided selectively, and one sensor may sense one time of exposing moment only.

Meanwhile, in the determination whether a semiconductor device remains, Blob analysis or the like may be used.

In the present embodiment, as shown in FIG. 3, the reason why the pair of cameras 381, 382 is positioned on the left side and right side is due to lack of space for a camera to be installed in the center. In case where only one camera is positioned on the left side or right side, all the photographed images taken by the camera for four columns are not suitable for processing by Blob analysis and also a photographing area for the camera is difficult to be secured. As described in the present embodiment, therefore, the cameras 381, 382 are positioned on the left side and right side of the gripping position (DP) respectively in order to separate into the first photographing area (PT1) for the first camera 381 and the second photographing area (PT2) for the second camera 382.

In the present embodiment, the reason why the first camera 381 and the second camera 382 do not take photographs of the test sockets 371 in the first row and second row at the same time is due to the fact that in some cases, the predetermined interval (L) between the device feeders 341, 342 may not be sufficient enough to take photographs of the test sockets 371 in the first row and the second row at the same time. Accordingly, the photographing method described in the present embodiment may provide a benefit from the point of the handler 300 to be downsized. In case where the handler is designed so as for the predetermined interval (L) to have a sufficient distance, it may be considered to take photographs of the test sockets 371 in the first row and second row at the same time.

As set forth above, while the present invention has been described in connection with the embodiments, the disclosure is merely illustrative, and the present invention is not limited thereto. It should be construed that the present invention has the widest range in compliance with the basic idea disclosed in the disclosure.

Although it is possible for those skilled in the art to combine and substitute the disclosed embodiments to embody the other types that are not specifically disclosed in the disclosure, they do not depart from the scope of the present invention as well. In addition, it will be apparent to those skilled in the art that various modifications and changes may be made with respect to the disclosed embodiments based on the disclosure in easy, and these changes and modifications also fall within the scope of the present invention.

What is claimed is:

1. A handler for testing semiconductor devices, the handler comprising:
    a socket plate having a plurality of test sockets electrically connected to a tester, wherein the test sockets are separated into a plurality of photographing areas;
    a camera fixed immovably;
    a first device feeder configured to move horizontally below the camera to feed the semiconductor devices to the test sockets or move horizontally below the camera to recover the semiconductor devices from the test sockets, the first device feeder having a plurality of pickers for gripping or releasing the semiconductor devices and being provided between the socket plate and the camera;
    a second device feeder configured to move horizontally below the camera to feed the semiconductor devices to the test sockets or move horizontally below the camera to recover the semiconductor devices from the test sockets, the second device feeder having a plurality of pickers for gripping or releasing the semiconductor devices and being provided between the socket plate and the camera, wherein the first device feeder and the second device feeder move together and are spaced apart from each other with a predetermined interval;
    a sensor sensing an exposing moment, while the first and the second device feeders move to feed or recover the semiconductor devices, wherein the exposing moment represents a time when at least one of the test sockets is exposed to the camera through the predetermined interval between the first device feeder and the second device feeder by a horizontal movement of the first and the second device feeders covering the at least one of the test sockets; and
    a controller configured to operate the camera to obtain an image including the at least one of the test sockets exposed through the predetermined interval between the first device feeder and the second device feeder and a top portion of the first and the second device feeder at the exposing moment during a horizontal movement of the first and the second device feeder to determine whether at least one semiconductor device remains in the test sockets by using the image obtained by the camera.

2. The handler of claim 1, wherein the first device feeder and the second device feeder feed the semiconductor devices to the test sockets alternatively or recover the semiconductor devices from the test sockets alternatively.

3. The handler of claim 2, wherein the test sockets are arranged in the socket plate with an M×N (where M≥1 and N≥2) matrix form.

4. The handler of claim 2, wherein the sensor senses a first exposing moment at which one of the test sockets is exposed to the camera through the predetermined interval, and a second exposing moment at which others of the test sockets are exposed to the camera through the predetermined interval.

5. The handler of claim 4, wherein the controller operates the camera to capture a first image at the first exposing moment and a second image at the second exposing moment, and determines whether at least on semiconductor device remains in the test sockets by using the first image and the second image.

6. The handler of claim 4, wherein the sensor is one of at least two sensors of the handler; and
    wherein one of the at least two sensors senses the first exposing moment and the other sensor of the at least two sensors senses the second exposing moment.

7. The handler of claim 1, wherein the camera is one of a plurality of cameras of the handler;
    wherein the plurality of cameras are positioned on the left and on the right based on the gripping position where the first and the second device feeders grip the semiconductor devices.

8. The handler of claim 7, wherein the test sockets are arranged in a matrix form of two or more rows;
    wherein a portion of cameras of the plurality of cameras take images of the test sockets corresponding to at least one of the more than two rows, and the other portion of cameras of the plurality of cameras take images of the test sockets corresponding to others of the more than two rows.

9. A method for checking whether a semiconductor device finished with testing remains without being recovered when testing semiconductor devices using a handler for testing the semiconductor devices, the method comprising:
    gripping the semiconductor devices using at least one of a first device feeder and a second device feeder provided between a socket plate and a camera fixed immovably,
        wherein the first device feeder comprises a plurality of pickers for gripping and releasing the semiconductor devices and grips the semiconductor devices finished with testing from a test socket plate in order to recover the semiconductor devices finished with testing,
        wherein the second device feeder comprises a plurality of pickers for gripping or releasing the semiconductor devices and grips the semiconductor devices to be tested in order to feed the semiconductor devices to be tested to a plurality of test sockets of the socket plate; and
        wherein the first device feeder and the second device feeder move together and are spaced apart from each other with a predetermined interval, moving the first device feeder to feed the semiconductor devices to the test sockets and the second device feeder to recover the semiconductor devices from the test sockets;

sensing an exposing moment through the predetermined interval between the first device feeder and the second device feeders, while the first device feeder and the second device feeders move horizontally below the camera to feed or recover the semiconductor devices to the test sockets, wherein the socket plate comprises a plurality of test sockets electrically connected to a tester, wherein the test sockets are separated into a plurality of photographing areas, and wherein the exposing moment represents a time when at least one of the test sockets is exposed to at least one camera by a horizontal movement of at least one of the first device feeder and the second device feeder covering said at least one of the test sockets;

obtaining an image including the at least one of the test sockets exposed through the predetermined interval between the first device feeder and the second device feeder and a top portion of the first device feeder or the second device feeder by the camera at the exposing moment during horizontal movement of the at least one of the first device feeder and the second device feeder; and determining whether at least one semiconductor device finished with testing remains in the test sockets by using the image.

10. The method of claim 9, wherein said sensing the exposing moment of the at least one of the test sockets to be exposed through the predetermined interval and said obtaining the image of the at least one of the test sockets are executed repeatedly when the first device feeder and the second device feeder move in a direction and when the first device feeder and the second device feeder move in an opposite direction of the one direction.

11. The method of claim 9, wherein said sensing the exposing moment of the test sockets to be exposed through the predetermined interval comprises:

sensing an exposing moment of a portion of the test sockets of the plurality of test sockets to be exposed through the predetermined interval; and sensing an exposing moment of the other portion of the test sockets of the plurality of test sockets to be exposed through the predetermined interval.

12. The method of claim 11, wherein said obtaining the image of the test socket comprises:

obtaining an image of the portion of the test sockets of the plurality of test sockets at the moment when the portion of the test sockets of the plurality of the test sockets is exposed; and obtaining an image of another portion of the test sockets of the plurality of test sockets at the moment when the other portion of the test sockets of the plurality of the test sockets is exposed.

13. The method of claim 12, wherein said determining whether any semiconductor device finished in testing remains in the test sockets comprises:

combining the image of the portion of test sockets with the image of the other portion of test sockets.

14. The handler of claim 1, wherein the test sockets are arranged in a matrix form of two or more rows, and wherein the predetermined interval is less than or equal to a width of one of the test sockets.

15. The method of claim 9, wherein the test sockets are arranged in a matrix form of two or more rows, and wherein the predetermined interval is less than or equal to a width of one of the test sockets.

* * * * *